United States Patent
Luo

(10) Patent No.: US 10,826,007 B2
(45) Date of Patent: Nov. 3, 2020

(54) BLUE THERMALLY ACTIVATED DELAYED FLUORESCENCE MATERIAL AND APPLICATION THEREOF

(71) Applicant: Wuhan China Star Optoelectronics Semiconductor Display Technology Co., Ltd., Wuhan (CN)

(72) Inventor: Jiajia Luo, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 130 days.

(21) Appl. No.: 16/319,343

(22) PCT Filed: Jan. 14, 2019

(86) PCT No.: PCT/CN2019/071522
§ 371 (c)(1),
(2) Date: Jan. 20, 2019

(87) PCT Pub. No.: WO2020/098146
PCT Pub. Date: May 22, 2020

(65) Prior Publication Data
US 2020/0161578 A1    May 21, 2020

(30) Foreign Application Priority Data
Nov. 15, 2018 (CN) .......................... 2018 1 1361403

(51) Int. Cl.
H01L 51/50 (2006.01)
C09K 11/06 (2006.01)
H01L 51/00 (2006.01)

(52) U.S. Cl.
CPC .......... *H01L 51/5012* (2013.01); *C09K 11/06* (2013.01); *H01L 51/0072* (2013.01)

(58) Field of Classification Search
None
See application file for complete search history.

(56) References Cited

U.S. PATENT DOCUMENTS

2007/0160871 A1* 7/2007 Morishita .......... H01L 51/0072
428/690

* cited by examiner

*Primary Examiner* — Kamal A Saeed

(57) ABSTRACT

A thermally activated delayed fluorescence (TADF) material and an application thereof are provided. The blue TADF material has an electron acceptor which exhibits good structural rigidity so as to improve thermal stability of molecules, and three blue TADF materials with good light-emitting properties are designed and synthesized by selecting different raw material-derived functional groups. Furthermore, the blue TADF material provided by the present invention is used as a luminescent material and is applied to an electroluminescent device that has good luminosity and an excellent effect.

10 Claims, 4 Drawing Sheets

BLUE THERMALLY ACTIVATED DELAYED FLUORESCENCE MATERIAL AND APPLICATION THEREOF

RELATED APPLICATIONS

This application is a National Phase of PCT Patent Application No. PCT/CN2019/071522 having International filing date of Jan. 14, 2019, which claims the benefit of priority of Chinese Patent Application No. 201811361403.3 filed on Nov. 15, 2018. The contents of the above applications are all incorporated by reference as if fully set forth herein in their entirety.

FIELD AND BACKGROUND OF THE INVENTION

The present invention relates to a field of a material used for planar display devices, and particularly to a blue thermally activated delayed fluorescence material and application thereof.

It is known that organic light-emitting diodes (OLEDs) have active light emission without a backlight, and the OLEDs have advantages of a high luminous efficiency, large viewing angles, fast response times, a wide tolerance of temperature, relatively simple processing techniques, a low driving voltage, a low energy consumption, being lighter and thinner, a flexible display, and good future application prospects, and thus many researchers focus on OLEDs. Moreover, the dominant guest luminescent material is critical for OLEDs.

Traditionally, the luminescent guest materials used in early OLEDs are fluorescence materials. Because the ratio of singlet and triplet excitons in the OLED is 1:3, the theoretical internal quantum efficiency (IQE) of fluorescent-based OLEDs is merely 25%. Therefore, application of fluorescent electroluminescent devices is greatly limited. The phosphorescent heavy-metal complexes can achieve 100% IQE by using singlet and triplet excitons simultaneously due to the spin-orbit coupling of heavy atoms. However, the used heavy-metals are precious metals, such as Ir and Pt, and the phosphorescent heavy-metal complexes served as blue light materials should be improved.

Pure organic thermally activated delayed fluorescence (TADF) materials have a lowest single-triplet level difference ($\Delta EST$) which is relatively less than ever before through a suitable molecular design, so that triplet excitons can be transformed to a singlet state by reverse intersystem crossing (RISC) and then are illuminated when jumping to a ground state transition by radiation. Therefore, single and triplet excitons can be simultaneously used and also achieve 100% IQE.

As for TADF materials, a high reaction rate constant of reverse intersystem enthalpy constant (kRISC) and a high photoluminescence quantum yield (PLQY) are necessary for fabricating highly efficient OLEDs. Currently, TADF materials with the features above are still relatively scarce as compared with heavy metal Ir complexes. Thus, phosphorescent heavy metal materials used in a field of blue light should be improved. In addition, there are few TADF materials used in that filed.

Therefore, design and synthesis of blue-light TADF materials for applying to the field is significant.

SUMMARY OF THE INVENTION

According to one embodiment of the present invention, a blue thermally activated delayed fluorescence (TADF) material is good in heat stability and has excellent blue light-emitting properties.

In one embodiment of the present invention, a blue thermally activated delayed fluorescence material has a structural formula represented as

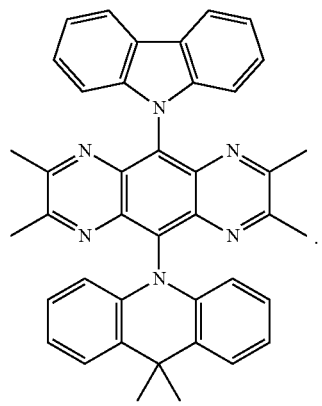

In one embodiment of the present invention, the compound 1 is synthesized from a raw material 1 and a carbazole, and the raw material 1 has a structural formula represented as

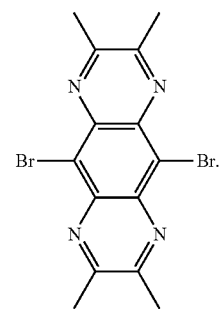 [SMILES: Cc1nc2c(Br)c3nc(C)c(C)nc3c(Br)c2nc1C]

In one embodiment of the present invention, an intermediate 1 is synthesized from the raw material 1 and the carbazole, and the intermediate 1 is combined with a raw material 2 represented as 9,10 dihydro-9,9-dimethyl acridine to yield the compound 1; and the intermediate 1 has a structural formula represented as

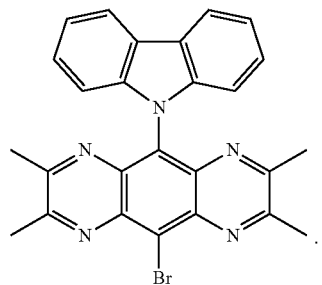

In one embodiment of the present invention, the compound 1 is synthesized through a synthetic route as follows:

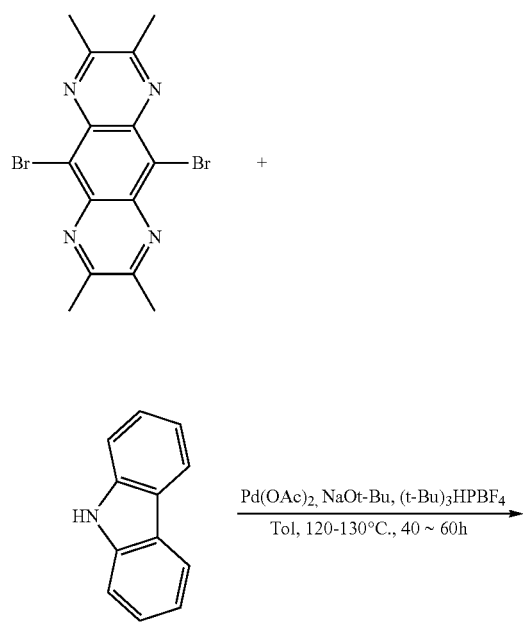

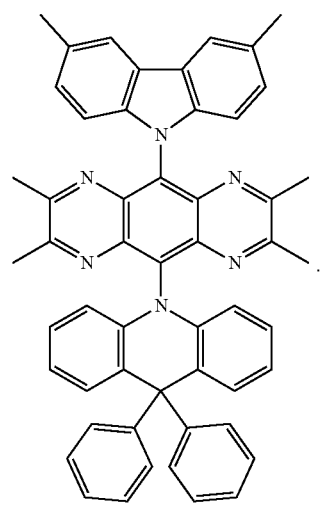

In one embodiment of the present invention, an intermediate 2 is firstly synthesized from the raw material 1 and the methyl carbazole, and the compound 2 is synthesized from the intermediate 2 and the 9,10-dihydro-9,9-diphenyl acridine; and the intermediate 2 has a structural formula represented as

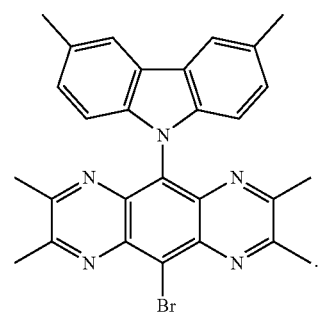

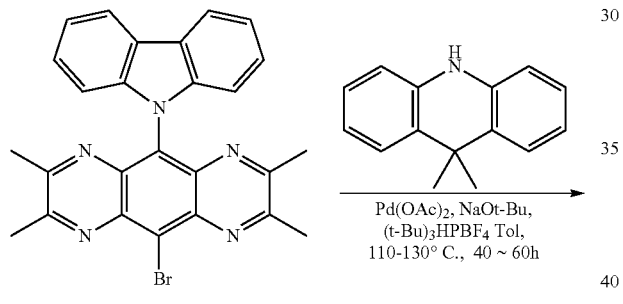

In one embodiment of the present invention, the compound 1 is synthesized through a synthetic route as follows:

In one embodiment of the present invention, a methyl carbazole is derived from the carbazole, 9,10-dihydro-9,9-diphenyl acridine is derived from the raw material 2, and a compound 2 is derived from the compound 1; and the compound 2 has a structural formula represented as

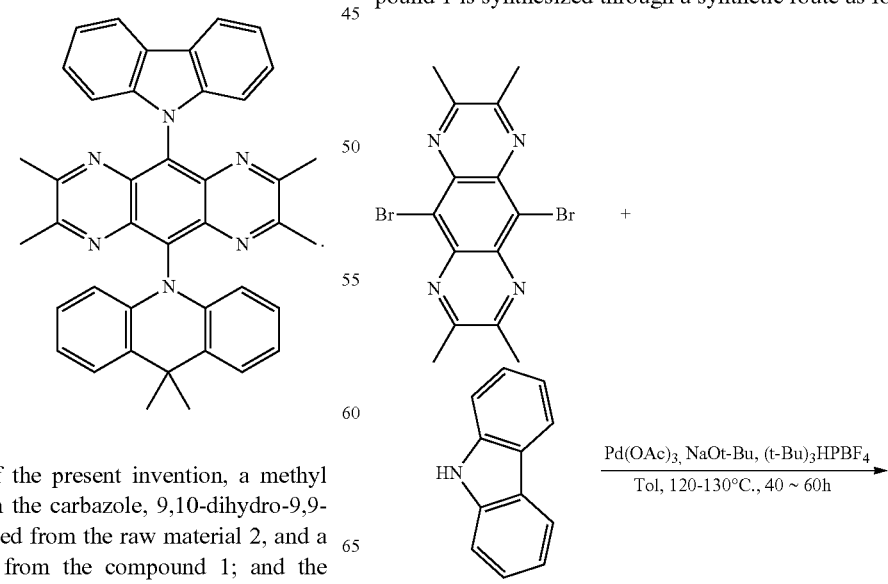

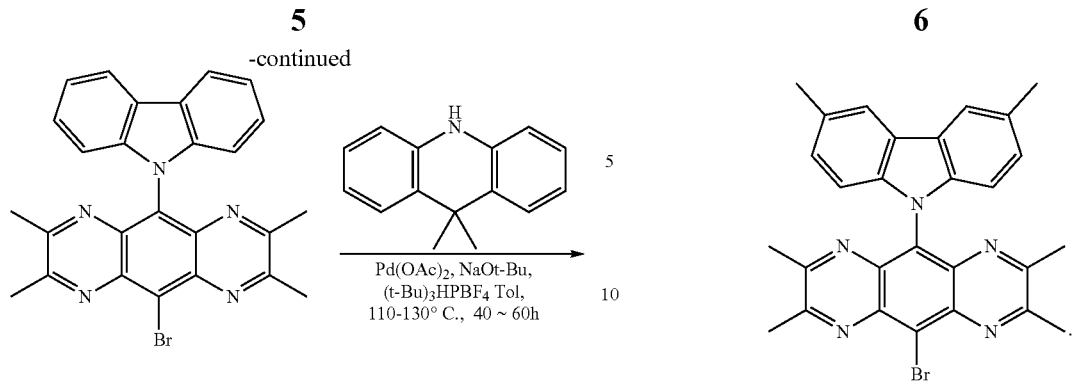

In one embodiment of the present invention, a methyl carbazole is derived from the carbazole, 9,10-dihydro-9,9-diphenyl acridine is derived from the raw material 2, and a compound 2 is derived from the compound 1; and the compound 2 has a structural formula represented as

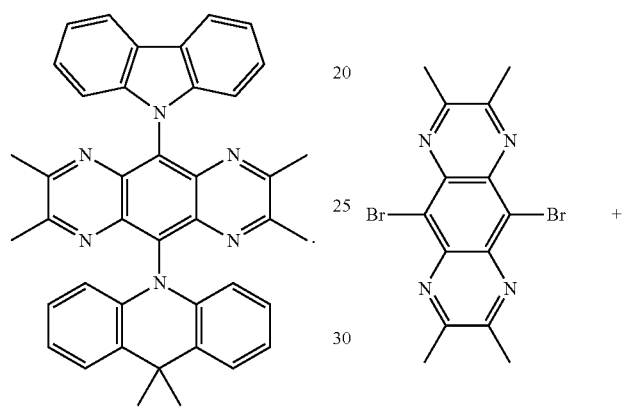

In one embodiment of the present invention, an intermediate 2 is firstly synthesized from the raw material 1 and the methyl carbazole, and the compound 2 is synthesized from the intermediate 2 and the 9,10-dihydro-9,9-diphenyl acridine; and the intermediate 2 has a structural formula represented as In one embodiment of the present invention, the compound 2 is synthesized through a synthetic route as follows:

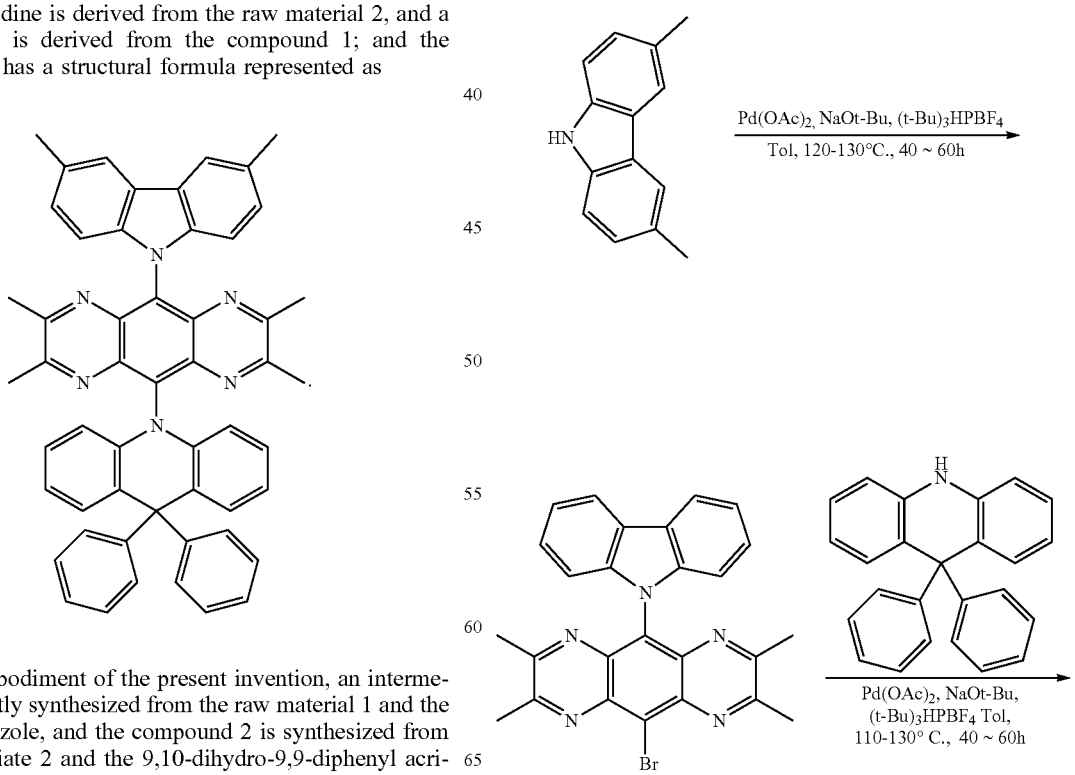

-continued

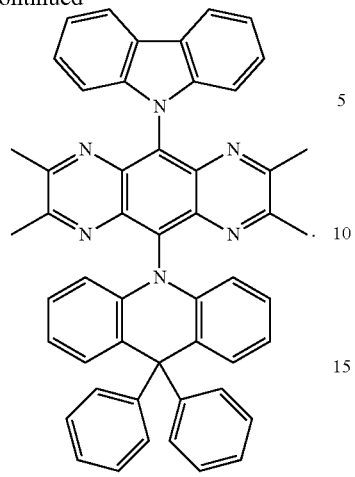

In one embodiment of the present invention, a tert-butylcarbazole is derived from the carbazole, and 9,10-dihydro-9,9-diphenylsilyl acridine is derived from the raw material 2, and a compound 3 is derived from the compound 1; and the compound 3 has a structural formula represented as

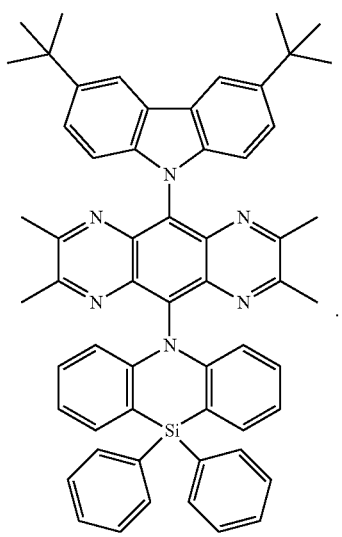

In one embodiment of the present invention, an intermediate 3 is firstly synthesized from the raw material 1 and the methyl carbazole, and the compound 3 is synthesized from the intermediate 3 and the 9,10-dihydro-9,9-diphenylsilyl acridine; and the intermediate 3 has a structural formula represented as

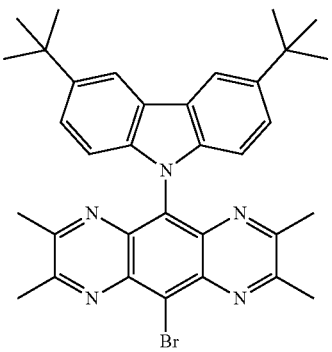

In one embodiment of the present invention, the compound 3 is synthesized through a synthetic route as follows:

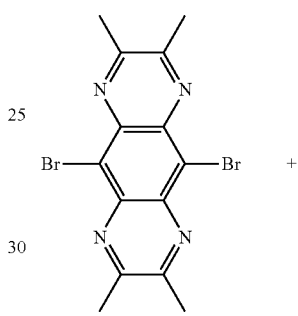

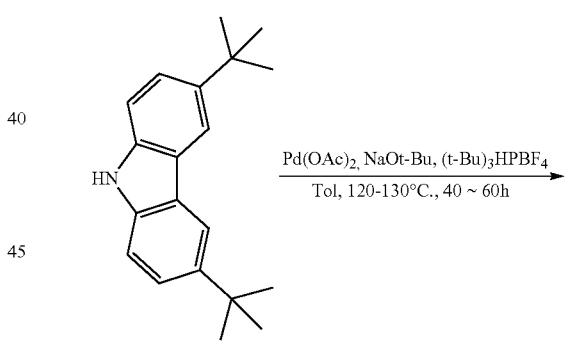

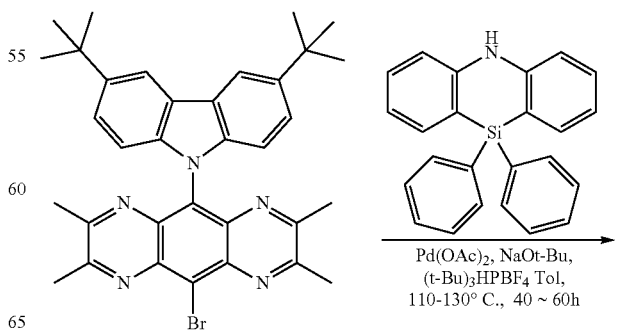

-continued

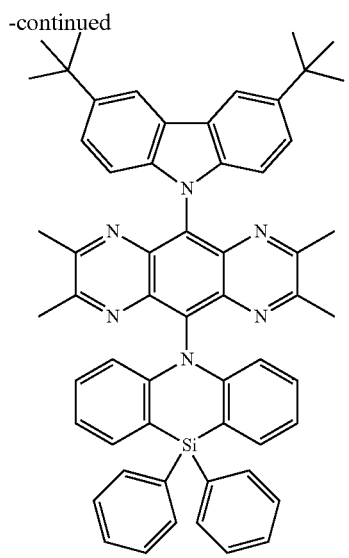

Furthermore, the three compounds in involved in the present invention are slightly different in molecular structure, but they are all synthesized from the raw material 1 combined with the carbazole or carbazole derivatives. That is, these compounds are derived from single creative concept and therefore conform to unity of invention, so they can be applied for protection in this application.

Furthermore, in another embodiment of the present invention, a method for preparing the compound 1 comprises steps described as follows.

The raw material 1, carbazole, palladium acetate, and tri-tert-butylphosphine tetrafluoroborate salt are added to a reaction bottle, and NaOt-Bu is added to a glove box. Then, dehydrated and degassed toluene is injected under an inert gas (for example, argon), and this reaction is performed at 110~130° C. for 40~60 hours.

Next, reaction liquid is cooled to room temperature and poured into ice water, and it is extracted with dichloromethane for 3 to 5 times. Then, the extracted reaction liquid is mixed with a silica gel served as organic phase and filled into columns, and then it is isolated and purified by column chromatography to obtain an intermediate 1 presented as a blue-white powder.

Next, the intermediate 1, 9,10-dihydro-9,9-dimethylacridine, palladium acetate, and tri-tert-butylphosphine tetrafluoroborate salt are added to the reaction bottle, and NaOt-Bu is added to the glove box. Then, dehydrated and degassed toluene is injected under an argon gas, and this reaction is performed at 110~130° C. for 40~60 hours.

Next, the reaction liquid is cooled to room temperature and poured into ice water, and then it is extracted with dichloromethane for 3 to 5 times. Then, the extracted reaction liquid is mixed with a silica gel served as organic phase and filled into columns, and it is isolated and purified by column chromatography to obtain a target compound 1.

Furthermore, in another embodiment of the present invention, a method for preparing the compound 2 comprises steps described as follows.

The raw material 1, methyl carbazole, palladium acetate, and tri-tert-butylphosphine tetrafluoroborate salt are added to a reaction bottle, and NaOt-Bu is added to a glove box. Then, dehydrated and degassed toluene is injected under an inert gas (for example, argon), and this reaction is performed at 110~130° C. for 40~60 hours.

Next, reaction liquid is cooled to room temperature and poured into ice water, and it is extracted with dichloromethane for 3 to 5 times. Then, the extracted reaction liquid is mixed with a silica gel served as organic phase and filled into columns, and then it is isolated and purified by column chromatography to obtain an intermediate 2 presented as a blue-white powder.

Next, the intermediate 2,9,10-dihydro-9,9-diphenylacridine, palladium acetate, and tri-tert-butylphosphine tetrafluoroborate salt are added to the reaction bottle, and NaOt-Bu is added to the glove box. Then, dehydrated and degassed toluene is injected under an argon gas, and this reaction is performed at 110~130° C. for 40~60 hours.

Next, the reaction liquid is cooled to room temperature and poured into ice water, and then it is extracted with dichloromethane for 3 to 5 times. Then, the extracted reaction liquid is mixed with a silica gel served as organic phase and filled into columns, and it is isolated and purified by column chromatography to obtain a target compound 2.

Furthermore, in another embodiment of the present invention, a method for preparing the compound 3 comprises steps described as follows.

The raw material 1, tert-butylcarbazole, palladium acetate, and tri-tert-butylphosphine tetrafluoroborate salt are added to a reaction bottle, and NaOt-Bu is added to a glove box. Then, dehydrated and degassed toluene is injected under an inert gas (for example, argon gas), and this reaction is performed at 110~130° C. for 40~60 hours.

Next, reaction liquid is cooled to room temperature and poured into ice water, and it is extracted with dichloromethane for 3 to 5 times. Then, the extracted reaction liquid is mixed with a silica gel served as organic phase and filled into columns, and then it is isolated and purified by column chromatography to obtain an intermediate 3 presented as a blue-white powder.

Next, the intermediate 3 (9,10-dihydro-9,9-diphenylsilyl acridine), palladium acetate, and tri-tert-butylphosphine tetrafluoroborate salt are added to the reaction bottle, and NaOt-Bu is added to the glove box. Then, dehydrated and degassed toluene is injected under an argon gas, and this reaction is performed at 110~130° C. for 40~60 hours.

Next, the reaction liquid is cooled to room temperature and poured into ice water, and then it is extracted with dichloromethane for 3 to 5 times. Then, the extracted reaction liquid is mixed with a silica gel served as organic phase and filled into columns, and it is isolated and purified by column chromatography to obtain a target compound 3.

Moreover, in another embodiment of the present invention, a display device is provided, and the display device comprises a light-emitting layer, and the light-emitting layer comprises one of the compound 1, the compound 2 or the compound 3 according to the present invention.

The present invention relates to a field of a material used for planar display devices and particularly to a blue thermally activated delayed fluorescence material and application thereof.

In comparison with prior art, the present invention has beneficial effects that a blue thermally activated delayed fluorescence material according to the present invention is good in heat stability and has excellent blue light-emitting properties.

Furthermore, the blue thermally activated delayed fluorescence material according to the present invention is applied to a light-emitting layer of an electroluminescent device, and results show an excellent device performance.

DESCRIPTION OF SPECIFIC EMBODIMENTS OF THE INVENTION

A blue thermally activated delayed fluorescence material and an application thereof according to the present invention are further described in detail below by referring to the accompanying drawings and embodiments.

In one embodiment of the present invention, a blue thermally activated delayed fluorescence material is provided, and the blue thermally activated delayed fluorescence material is consisted of a compound 1. The compound 1 has a structural formula represented as

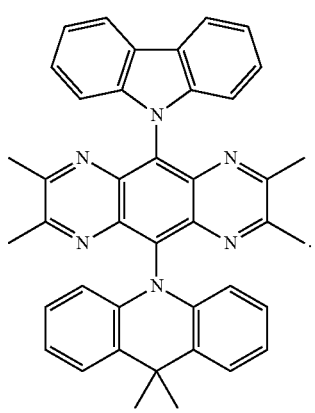

Furthermore, a compound 2 and a compound 3 are also derived from the compound 1 by combining different raw material-derived functional groups. The compound 2 has a structural formula represented as

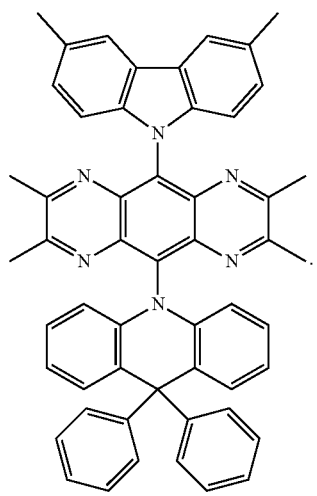

The compound 3 has a structural formula represented as

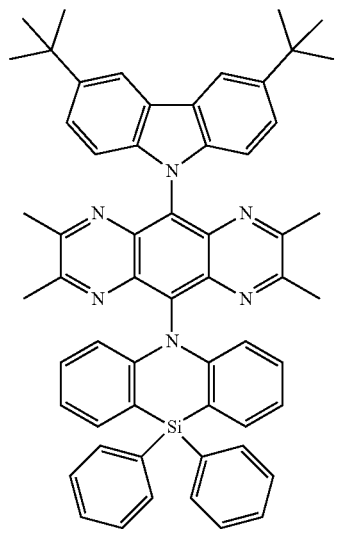

Referring to FIG. 1 to FIG. 6, they illustrate the distribution of electron levels of the highest occupied molecular orbital (HOMO) of the three compounds involved in the present invention and the distribution of electron levels of the lowest unoccupied molecular orbital (LUMO) thereof.

Furthermore, the compound 1, the compound 2, and the compound 3 having the lowest singlet state (S1), the lowest triplet energy level (T1), and electrochemical energy levels are shown as below in the table:

|  | PL Peak (nm) | $S_1$ (eV) | $T_1$ (eV) | $\Delta E_{ST}$ (eV) | HOMO (eV) | LUMO (eV) |
| --- | --- | --- | --- | --- | --- | --- |
| Compound 1 | 427 | 2.90 | 2.78 | 0.12 | −5.31 | −2.13 |
| Compound 2 | 428 | 2.89 | 2.76 | 0.13 | −5.42 | −2.14 |
| Compound 3 | 447 | 2.78 | 2.64 | 0.14 | −5.42 | −2.13 |

Figure 1:
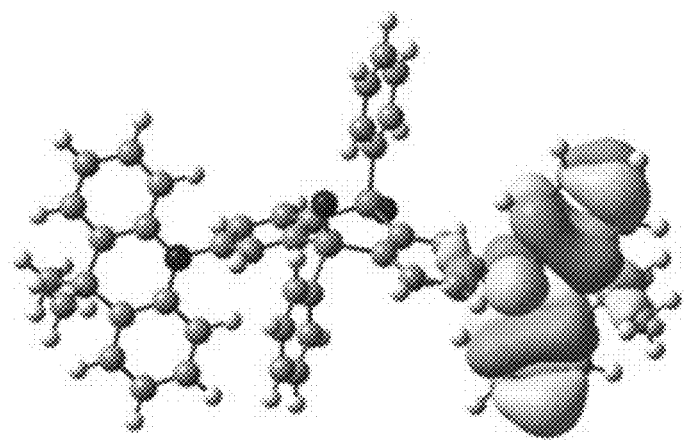
FIG. 1 is a blue thermally activated delayed fluorescence material according to one embodiment of the present invention, and the structure of a compound 1 is theoretically calculated to obtain a distribution diagram of an electron level of the highest occupied molecular orbital (HOMO).
Figure 2:
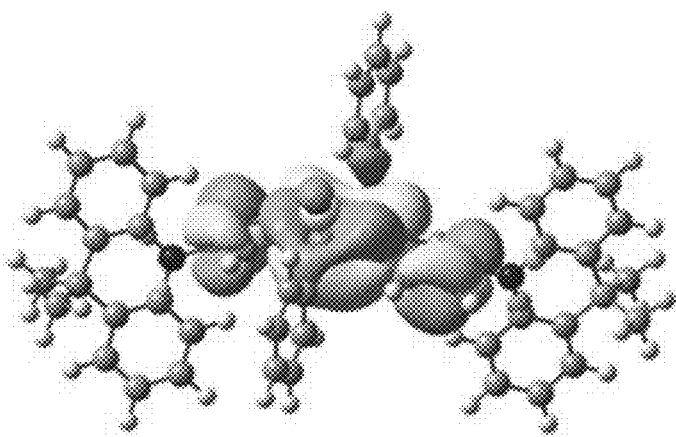
FIG. 2 is a distribution diagram of an electron level of the lowest unoccupied molecular orbital (LUMO) of the blue thermally activated delayed fluorescence material shown in FIG. 1 that is theoretically calculated.
Figure 3:
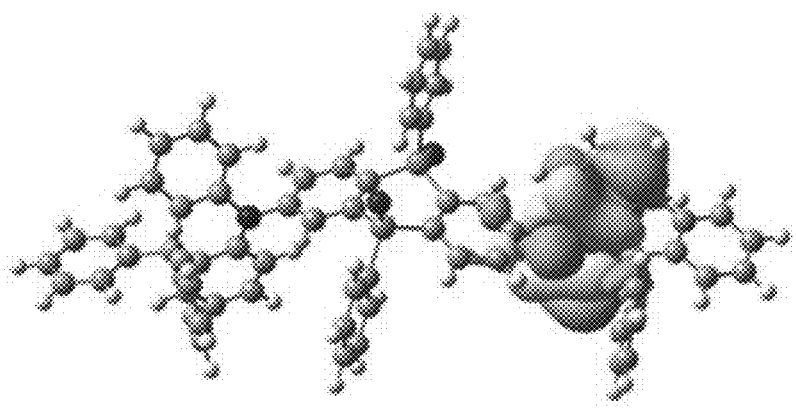
FIG. 3 is a blue thermally activated delayed fluorescence material according to one embodiment of the present invention, and the structure of a compound 2 is theoretically calculated to obtain a distribution diagram of an electron level of the highest occupied molecular orbital (HOMO).
Figure 4:
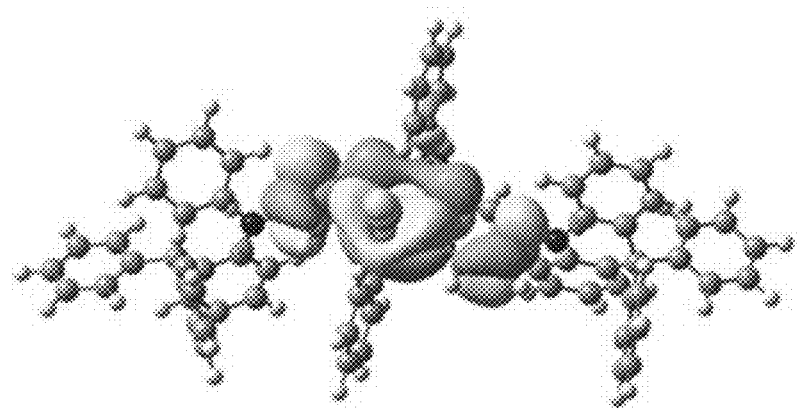
FIG. 4 is a distribution diagram of an electron level of the lowest unoccupied molecular orbital (LUMO) of the blue heat-activated delayed fluorescence material shown in FIG. 3 that is theoretically calculated.
Figure 5:
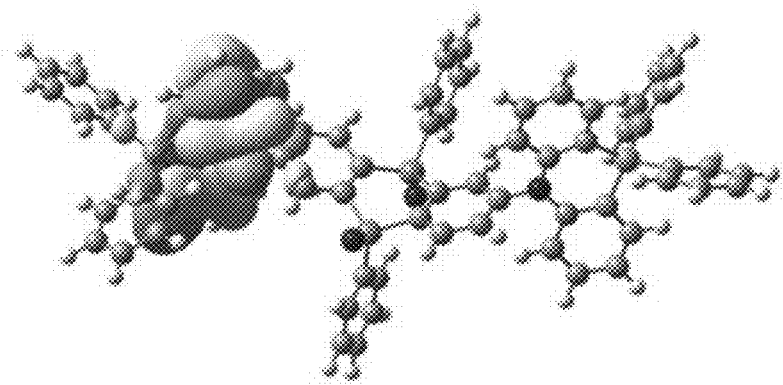
FIG. 5 is a blue thermally activated delayed fluorescence material according to one embodiment of the present invention, and the structure of a compound 3 is theoretically calculated to obtain a distribution diagram of an electron level of the highest occupied molecular orbital (HOMO).
Figure 6:
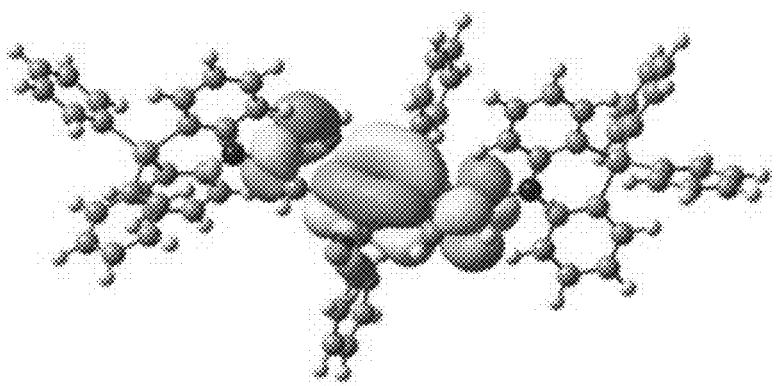
FIG. 6 is a distribution diagram of the electron level of the lowest unoccupied molecular orbital (LUMO) of the blue heat-activated delayed fluorescence material shown in FIG. 5 that is theoretically calculated.
Figure 7:
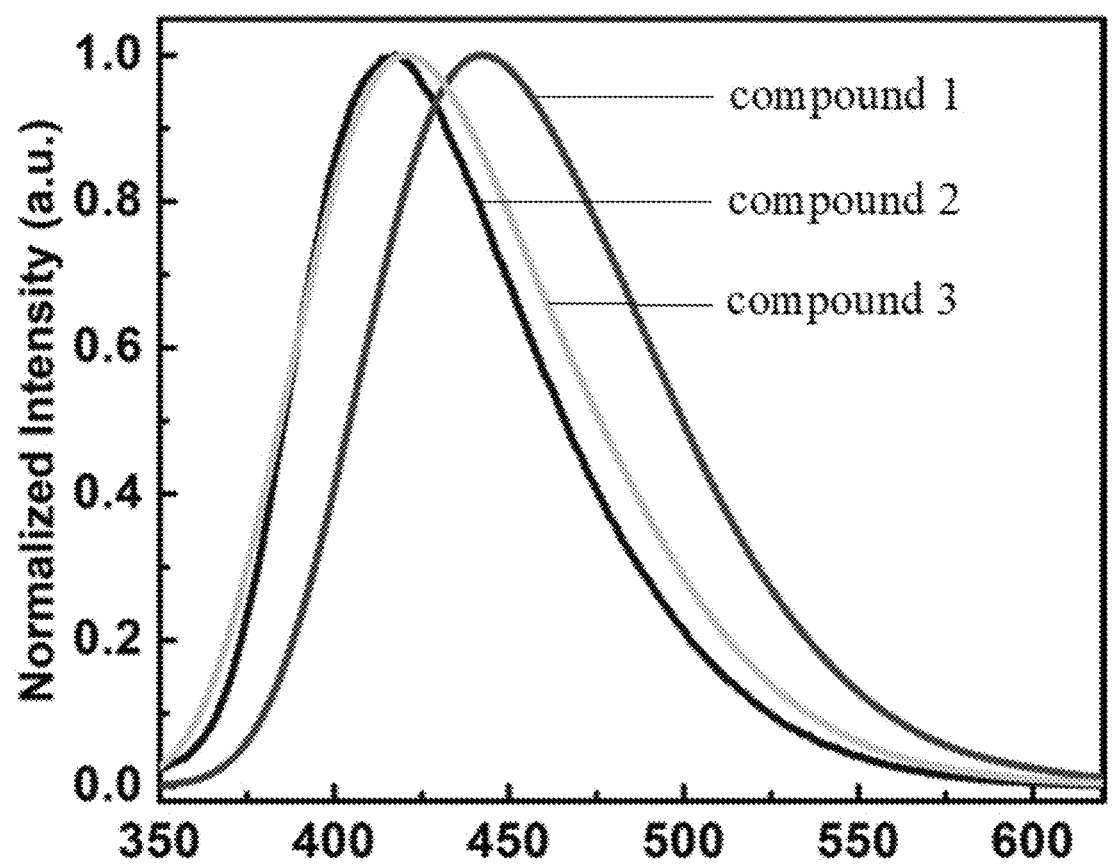
FIG. 7 is a photoluminescence spectrum of each compound in a toluene solution at room temperature according to three embodiments of the present invention.

Referring to FIG. 7, it illustrates a photoluminescence spectrum of the three different compounds in a toluene solution at room temperature according to three embodiments of the present invention.

Figure 8:
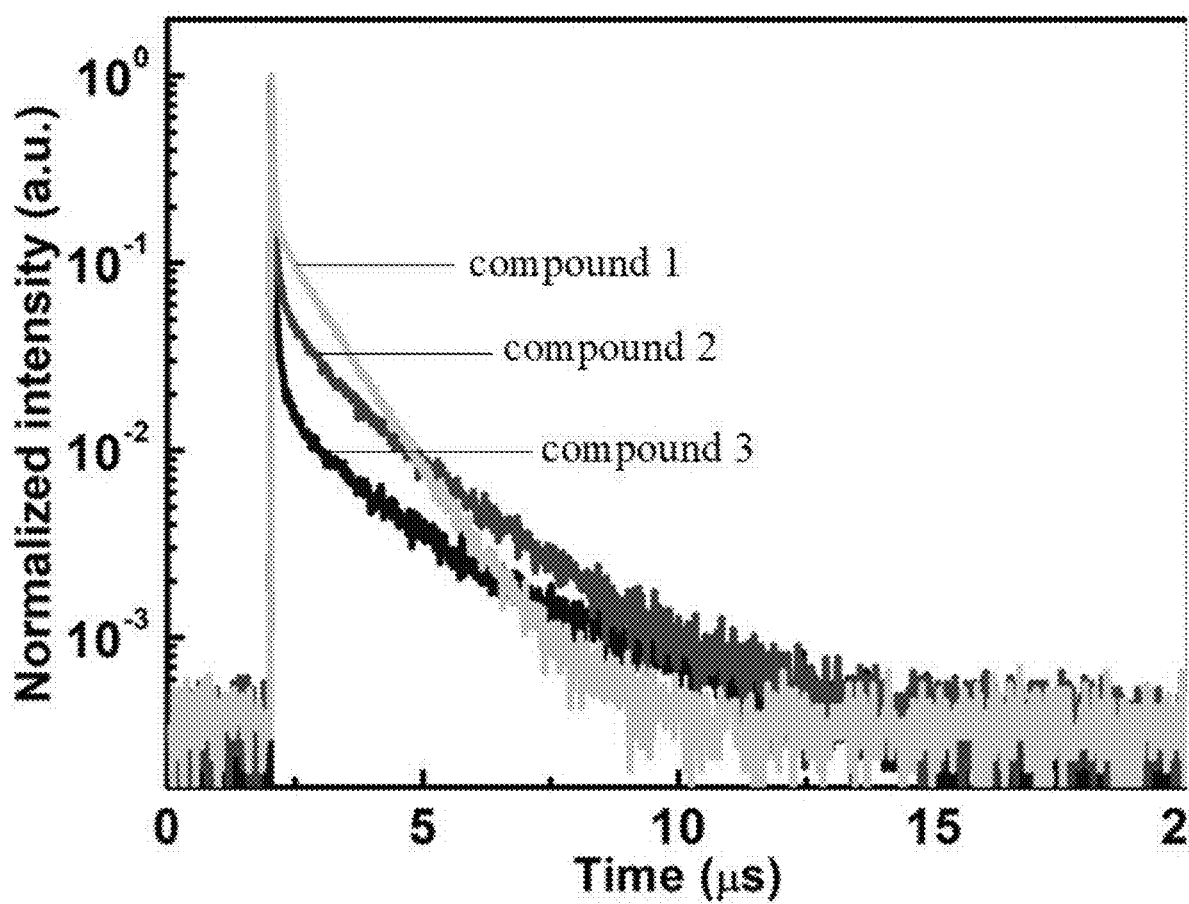
FIG. 8 is a transient photoluminescence spectrum of each compound in a toluene solution at room temperature according to three embodiments of the present invention.

Referring to FIG. 8, it illustrates a transient photoluminescence spectrum of the three different compounds in a toluene solution at room temperature according to three embodiments of the present invention.

Each of the compounds are further described in detail below in connection with a specific method for preparing each compound.

In one embodiment, the compound 1 is synthesized through a synthetic route as follows:

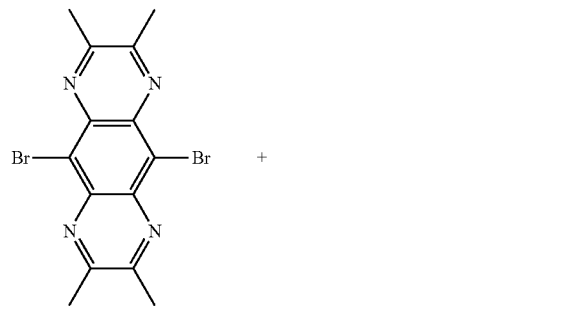

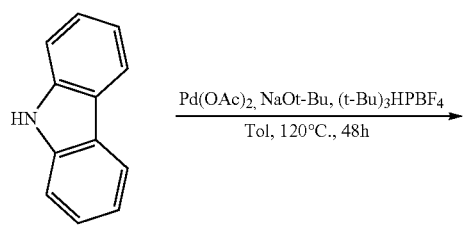

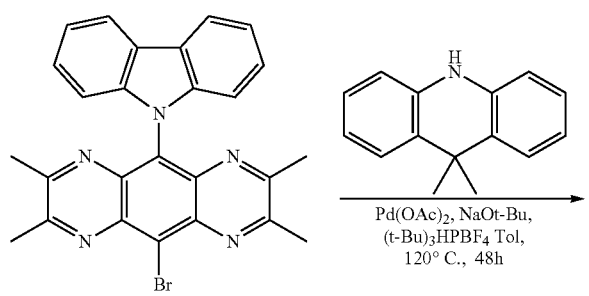

-continued

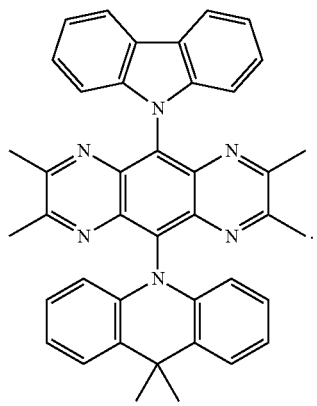

Specifically, it includes steps described as follows.

Raw material 1 (3.93 g, 10 mmol), carbazole (1.67 g, 10 mmol), palladium acetate (90 mg, 0.4 mmol), and tri-tert-butylphosphine tetrafluoroborate salt (0.34 g, 1.2 mmol) are added to a 100 mL twin neck bottle, and NaOt-Bu (1.16 g, 12 mmol) is added to a glove box. Then, dehydrated and degassed toluene (40 mL) is injected under an argon gas, and this reaction is performed at 120° C. for 48 hours.

Next, the reaction liquid is cooled to room temperature and poured into 50 mL ice water, and then it is extracted with dichloromethane for 3 times. Then, the extracted reaction liquid is mixed with a silica gel served as an organic phase and filled into columns, and it is isolated and purified by column chromatography (Dichloromethane: Hexane, v:v, 2:1) to obtain an intermediate 1 (3.1 g) presented as a blue-white powder. A yield of the intermediate 1 is 64%. (1H NMR (300 MHz, $CD_2Cl_2$, δ): 8.55 (d, J=7.2 Hz, 2H), 7.94 (d, J=6.9 Hz, 2H), 7.35-7.16 (m, 4H), 2.76 (s, 12H). MS (EI) m/z: [M]+ calcd for $C_{26}H_{20}BrN_5$, 481.09; found, 481.03. Anal. Calcd for $C_{26}H_{20}BrN_5$: C 64.74, H 4.18, N 14.52; found: C 64.67, H 4.07, N 14.38.)

The intermediate 1 (2.4 g, 5 mmol), 9,10 dihydro-9,9-dimethyl acridine (1.14 g, 6 mmol), palladium acetate (45 mg, 0.2 mmol), and tri-tert-butylphosphine tetrafluoroborate salt (0.17 g, 0.6 mmol) are added to a 100 mL twin neck bottle, and NaOt-Bu (0.58 g, 6 mmol) is added to the glove box. Then, dehydrated and degassed toluene (40 mL) is injected under an argon gas, and this reaction is performed at 120° C. for 48 hours.

Next, the reaction liquid is cooled to room temperature and poured into 50 mL ice water, and it is extracted with dichloromethane for 3 times. Then, the extracted reaction liquid is mixed with the silica gel served as the organic phase and filled into columns, and then it is isolated and purified by column chromatography (Dichloromethane: Hexane, v:v, 2:1) to obtain the target compound 1 (1.6 g) presented as a blue-white powder. A yield of the compound 1 is 49%. (1H NMR (300 MHz, $CD_2Cl_2$, δ): 8.55 (d, J=7.2 Hz, 2H), 7.94 (d, J=6.9 Hz, 2H), 7.35-7.16 (m, 10H), 7.01-6.95 (m, 2H), 2.76 (s, 12H), 1.69 (s, 6H). MS (EI) m/z: [M]+ calcd for $C_{41}H_{34}N_6$, 610.28; found, 610.23. Anal. Calcd for $C_{41}H_{34}N_6$: C 80.63, H 5.61, N 13.76; found: C 80.55, H 5.53, N 13.58.)

In one embodiment, the compound 2 is synthesized through a synthetic route as follows:

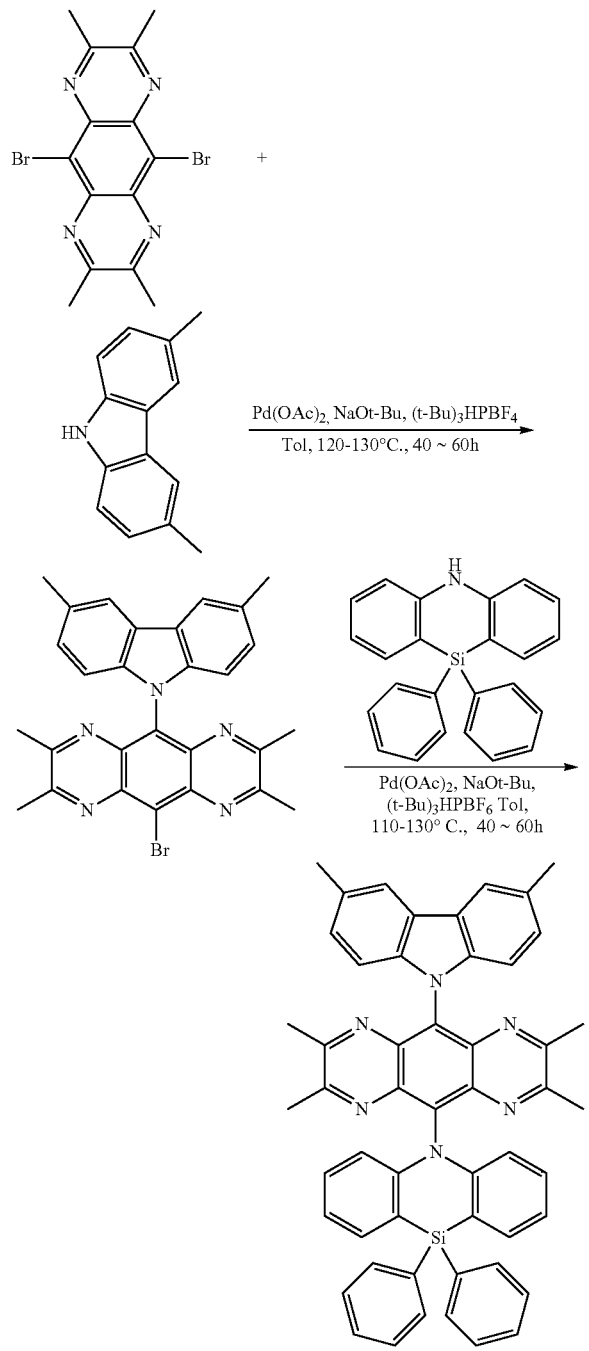

Specifically, it includes steps described as follows.

Raw material 1 (3.93 g, 10 mmol), methyl carbazole (1.95 g, 10 mmol), palladium acetate (90 mg, 0.4 mmol), and tri-tert-butylphosphine tetrafluoroborate salt (0.34 g, 1.2 mmol) are added to a 100 mL twin neck bottle, and NaOt-Bu (1.16 g, 12 mmol) is added to a glove box. Then, dehydrated and degassed toluene (40 mL) is injected under an argon gas, and this reaction is performed at 120° C. for 48 hours.

Next, the reaction liquid is cooled to room temperature and poured into 50 mL ice water, and then it is extracted with dichloromethane for 3 times. Then, the extracted reaction liquid is mixed with a silica gel served as an organic phase and filled into columns, and it is isolated and purified by column chromatography (Dichloromethane: Hexane, v:v, 2:1) to obtain an intermediate 2 (3.3 g) presented as a blue-white powder. A yield of the intermediate 2 is 65%. (1H NMR (300 MHz, $CD_2Cl_2$, δ): 8.30 (s, 2H), 7.69 (d, J=6.3 Hz, 2H), 7.38 (d, J=6.0 Hz, 2H), 2.76 (s, 12H), 2.46 (s, 6H). MS (EI) m/z: [M]+ calcd for $C_{28}H_{24}BrN_5$, 509.12; found, 509.03. Anal. Calcd for $C_{28}H_{24}BrN_5$: C 65.89, H 4.74, N 13.72; found: C 65.67, H 4.67, N 13.51.)

The intermediate 2 (2.6 g, 5 mmol), 9,10 dihydro-9,9-diphenyl acridine (2.0 g, 6 mmol), palladium acetate (45 mg, 0.2 mmol), and tri-tert-butylphosphine tetrafluoroborate salt (0.17 g, 0.6 mmol) are added to a 100 mL twin neck bottle, and NaOt-Bu (0.58 g, 6 mmol) is added to the glove box. Then, dehydrated and degassed toluene (40 mL) is injected under an argon gas, and this reaction is performed at 120° C. for 48 hours.

Next, the reaction liquid is cooled to room temperature and poured into 50 mL ice water, and it is extracted with dichloromethane for 3 times. Then, the extracted reaction liquid is mixed with the silica gel served as the organic phase and filled into columns, and then it is isolated and purified by column chromatography (Dichloromethane: Hexane, v:v, 2:1) to obtain the target compound 2 (2.1 g) presented as a blue-white powder. A yield of the compound 2 is 55%. (1H NMR (300 MHz, $CD_2Cl_2$, δ): 8.30 (s, 2H), 7.69 (d, J=6.3 Hz, 2H), 7.50 (d, J=6.0 Hz, 2H), 7.38-7.09 (m, 12H), 6.96-6.83 (m, 6H), 2.76 (s, 12H), 2.46 (s, 6H). MS (EI) m/z: [M]+ calcd for $C_{53}H_{42}N_6$, 762.35; found, 762.27. Anal. Calcd for $C_{53}H_{42}N_6$: C 83.44, H 5.55, N 11.02; found: C 83.37, H 5.47, N 10.91.)

In one embodiment, the compound 3 is synthesized through a synthetic route as follows:

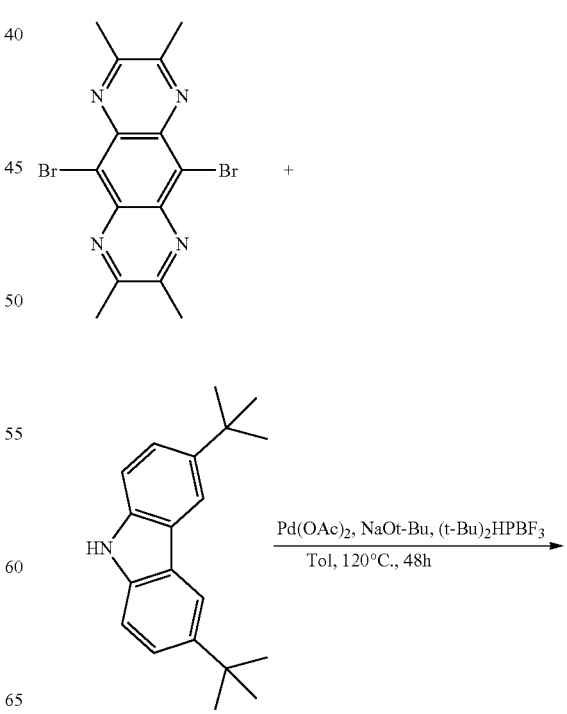

-continued

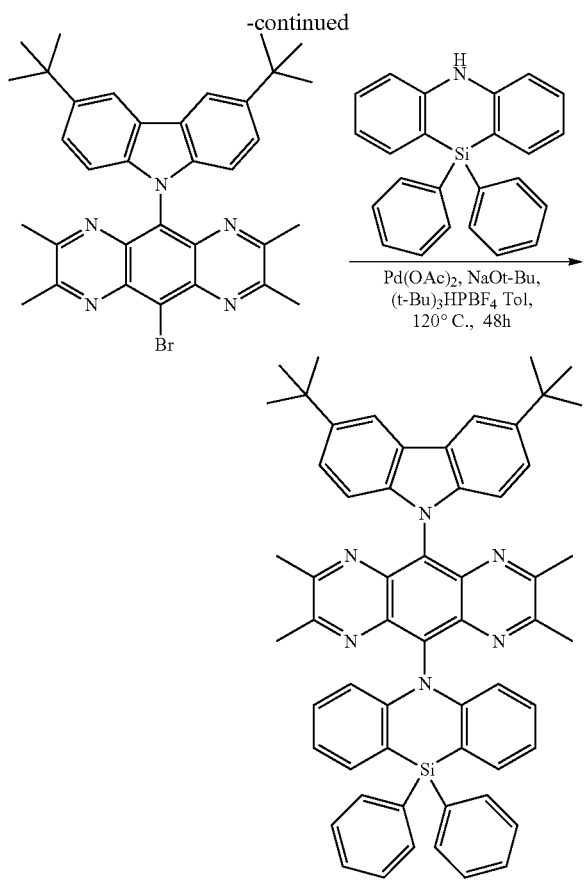

Specifically, it includes steps described as follows.

Raw material 1 (3.93 g, 10 mmol), tert-butylcarbazole (2.79 g, 10 mmol), palladium acetate (90 mg, 0.4 mmol), and tri-tert-butylphosphine tetrafluoroborate salt (0.34 g, 1.2 mmol) are added to a 100 mL twin neck bottle, and NaOt-Bu (1.16 g, 12 mmol) is added to a glove box. Then, dehydrated and degassed toluene (40 mL) is injected under an argon gas, and this reaction is performed at 120° C. for 48 hours.

Next, the reaction liquid is cooled to room temperature and poured into 50 mL ice water, and then it is extracted with dichloromethane for 3 times. Then, the extracted reaction liquid is mixed with a silica gel served as an organic phase and filled into columns, and it is isolated and purified by column chromatography (Dichloromethane: Hexane, v:v, 2:1) to obtain an intermediate 3 (3.6 g) presented as a blue-white powder. A yield of the intermediate 3 is 61%. (1H NMR (300 MHz, CD$_2$Cl$_2$, δ): 8.51 (s, 2H), 7.86 (d, J=6.3 Hz, 2H), 7.59 (d, J=7.2 Hz, 2H), 2.76 (s, 12H), 1.43 (s, 18H). MS (EI) m/z: [M]+ calcd for C$_{34}$H$_{36}$BrN$_5$, 593.22; found, 593.13. Anal. Calcd for C$_{34}$H$_{36}$BrN$_5$: C 68.68, H 6.10, N 11.78; found: C 68.61, H 6.07, N 11.58.)

The intermediate 3 (3.0 g, 5 mmol), 9,10-dihydro-9,9-diphenylsilyl acridine (2.1 g, 6 mmol), palladium acetate (45 mg, 0.2 mmol), and tri-tert-butylphosphine tetrafluoroborate salt (0.17 g, 0.6 mmol) are added to a 100 mL twin neck bottle, and NaOt-Bu (0.58 g, 6 mmol) is added to the glove box. Then, dehydrated and degassed toluene (40 mL) is injected under an argon gas, and this reaction is performed at 120° C. for 48 hours.

Next, the reaction liquid is cooled to room temperature and poured into 50 mL ice water, and it is extracted with dichloromethane for 3 times. Then, the extracted reaction liquid is mixed with the silica gel served as the organic phase and filled into columns, and then it is isolated and purified by column chromatography (Dichloromethane: Hexane, v:v, 2:1) to obtain the target compound 3 (1.5 g) presented as a blue-white powder. A yield of the compound 3 is 35%. (1H NMR (300 MHz, CD$_2$Cl$_2$, δ): 8.51 (m, 2H), 7.86 (d, J=6.3 Hz, 2H), 7.59 (d, J=7.2 Hz, 2H), 7.39-7.08 (m, 12H), 7.01-6.93 (m, 6H), 2.76 (s, 12H), 1.43 (s, 18H). MS (EI) m/z: [M]+ calcd for C$_{58}$H$_{54}$N$_6$Si, 862.42; found, 862.23. Anal. Calcd for C$_{58}$H$_{54}$N$_6$Si: C 80.70, H 6.31, N 9.74; found: C 80.59, H 6.27, N 9.58.)

Furthermore, the blue thermally activated delayed fluorescence material according to the present invention can be used to constitute a light-emitting layer in an electrothermally activated delayed fluorescence device.

In one embodiment, the electrothermally activated delayed fluorescence device comprises a substrate layer composed of glass and conductive glass (ITO), a hole transport layer, a hole injecting layer (poly 3,4-ethylenedioxythiophene: polystyrene sulfonate, PEDOT:PSS), a light-emitting layer (the blue thermally activated delayed fluorescence material and DPEPO according to the present invention), an electron transport layer (1,3,5-tris(3-(3-pyridyl)phenyl)benzene Tm3PyPB), and a cathode layer (lithium fluoride/aluminum).

Furthermore, in a specific method for fabricating the above-mentioned electroluminescent device, it may be sequentially spin-coated PESOT: PSS, DPEPO, and the blue thermally activated delayed fluorescence material of the present invention on a cleaned conductive glass (ITO) substrate. Then, TmPyPB, 1 nm of LiF, and 100 nm of Al are deposited under high vacuum conditions through a vapor deposition process.

The devices with different compounds are described as follows:
device 1: ITO/PEDOT:PSS (50 nm)/DPEPO:compound 1 (5% 40 nm)/TmPyPB (40 nm)/LiF (1 nm)/Al (100 nm);
device 2: ITO/PEDOT:PSS (50 nm)/DPEPO:compound 2 (5% 40 nm)/TmPyPB (40 nm)/LiF (1 nm)/Al (100 nm); and
device 3: ITO/PEDOT:PSS (50 nm)/DPEPO:compound 3 (5% 40 nm)/TmPyPB (40 nm)/LiF (1 nm)/Al (100 nm).

Furthermore, each of the above-mentioned electroluminescent device performances is measured, and current-brightness-voltage characteristics of the devices are achieved by a Keithley source measurement system (Keithley 2400 Sourcemeter, Keithley 2000 Currentmeter) with a silicon photodiode which is calibrated. An electroluminescence spectrum is measured by the French JY SPEX CCD3000 spectrometer, and all measurements are performed at room temperature in the atmosphere.

The data of each of the devices are shown in the following table:

| Device | Maximum Brightness (cd/m$^2$) | Maximum current efficiency (cd/A) | CIEy | Maximum external quantum efficiency (%) |
| --- | --- | --- | --- | --- |
| Device 1 | 2367 | 13.2 | 0.08 | 16.3 |
| Device 2 | 3123 | 14.3 | 0.09 | 17.1 |
| Device 3 | 3278 | 29.4 | 0.19 | 21.8 |

A blue thermally activated delayed fluorescence material, according to the present invention, is good in heat stability and has excellent blue light-emitting properties. Furthermore, the blue thermally activated delayed fluorescence material, according to the present invention, is applied to a light-emitting layer of an electroluminescent device, and results show excellent device performance.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A blue thermally activated delayed fluorescence material comprising a compound 1, wherein compound 1 is represented by Formula

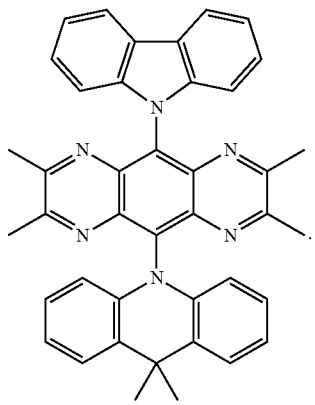

2. A method of preparing the blue thermally activated delayed fluorescence material according to claim 1, comprising reacting a raw material 1 of Formula

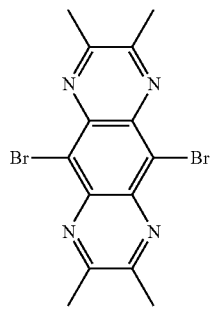 [SMILES: Cc1nc2c(Br)c3nc(C)c(C)nc3c(Br)c2nc1C]

and a carbazole.

3. The method according to claim 2, wherein an intermediate 1, of Formula

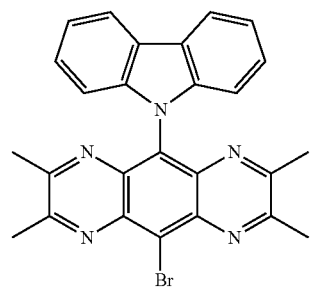

is combined with raw material 2, represented as, 9,10-dihydro-9,9-dimethyl acridine to yield the compound 1.

4. The method according to claim 3, wherein the compound 1, is prepared through a synthetic route as follows:

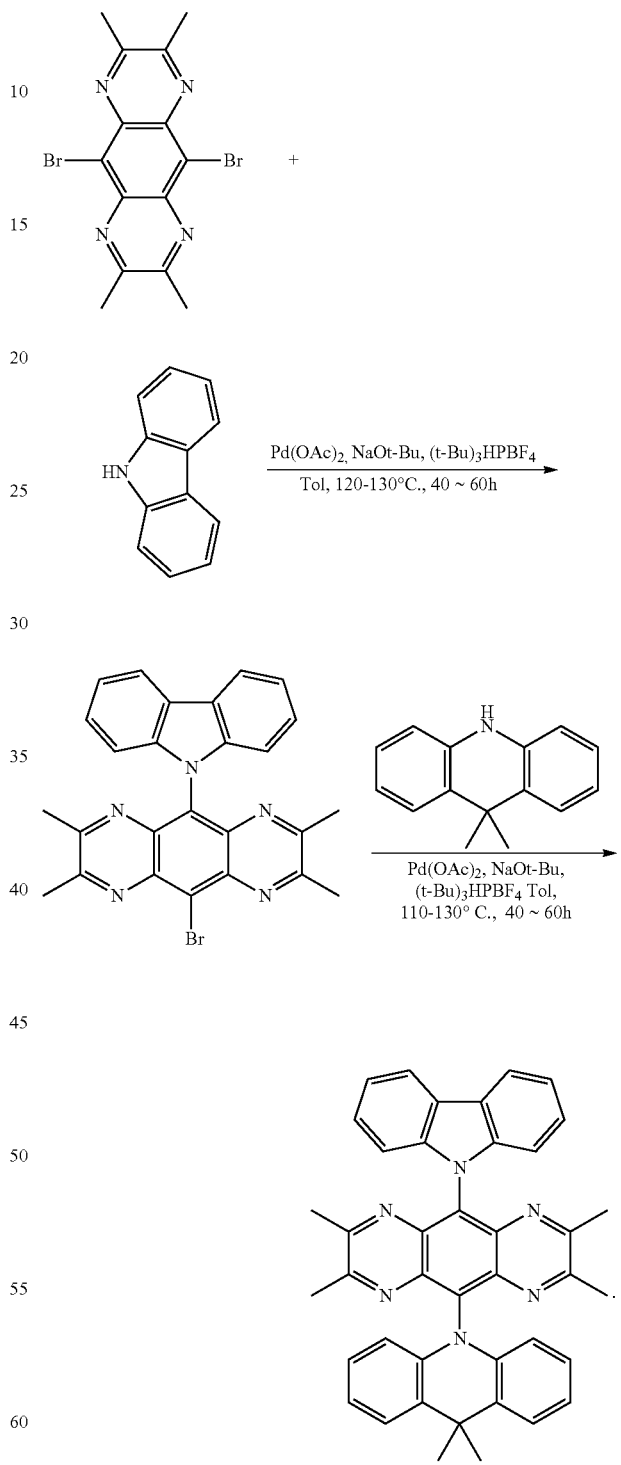

5. The method according to claim 3, wherein a methyl carbazole is derived from the carbazole; 9,10-dihydro-9,9-diphenyl acridine is derived from 9,10-dihydro-9,9-dimethyl acridine and compound 2 of Formula

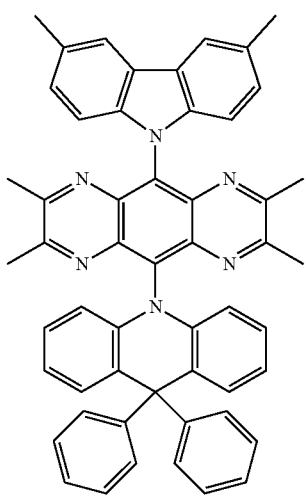

is derived from compound 1.

6. The method according to claim 5, wherein an intermediate 2 of Formula

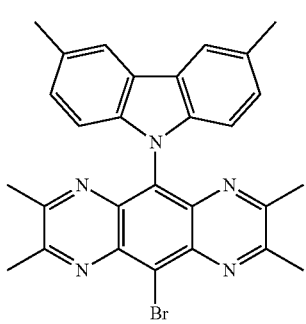

is prepared form raw material 1 and the methyl carbazole; and compound 2 is prepared from the intermediate 2 and the 9,10-dihydro-9,9-diphenyl acridine.

7. The method according to claim 6, wherein the compound 2, is prepared through a synthetic route as follows:

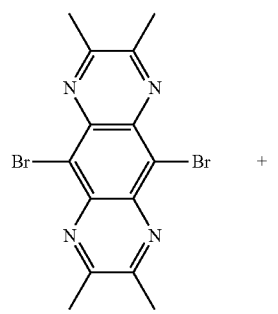 +

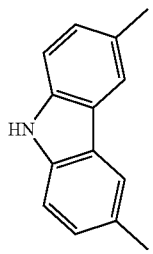

Pd(OAc)$_2$, NaOt-Bu, (t-Bu)$_3$HPBF$_4$
Tol, 120-130°C., 40 ~ 60h

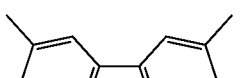 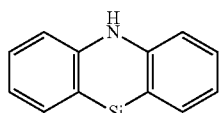

Pd(OAc)$_2$, NaOt-Bu,
(t-Bu)$_3$HPBF$_6$ Tol,
110-130° C., 40 ~ 60h

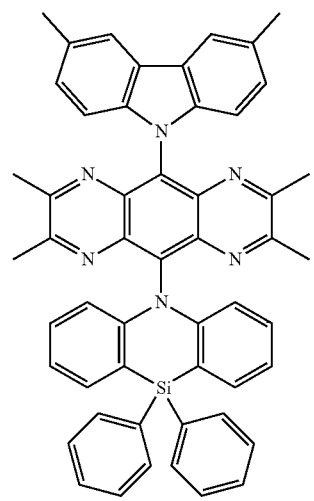

8. The method according to claim 3, wherein a tert-butylcarbazole is derived from the carbazole; 9,10-dihydro-9,9-diphenylsilyl acridine is derived from 9,10-dihydro-9,9-dimethyl acridine and compound 3 of Formula

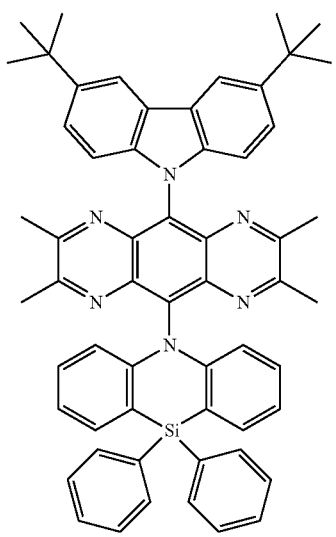 [SMILES: Cc1nc2c(N3c4ccccc4[Si](c4ccccc4)(c4ccccc4)c4ccccc43)c3nc(C)c(C)nc3c(-n3c4ccc(C(C)(C)C)cc4c4cc(C(C)(C)C)ccc43)c2nc1C]
is derived from compound 1.
9. The method according to claim 8, wherein an intermediate 3, of Formula
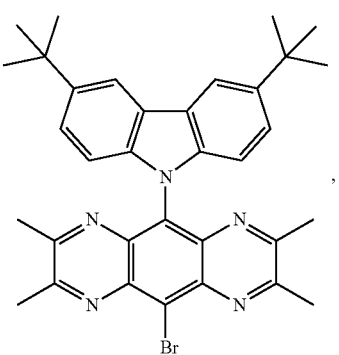 [SMILES: Cc1nc2c(Br)c3nc(C)c(C)nc3c(-n3c4ccc(C(C)(C)C)cc4c4cc(C(C)(C)C)ccc43)c2nc1C]
is prepared form raw material 1 and the methyl carbazole; and compound 3 is prepared from the intermediate 3 and the 9,10-dihydro-9,9-diphenylsilyl acridine.
10. The method according to claim 8, wherein the compound 3, is prepared through a synthetic route as follows:
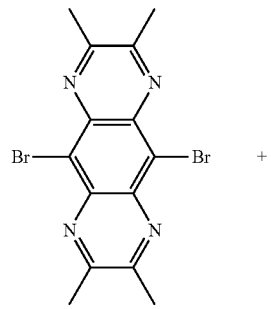
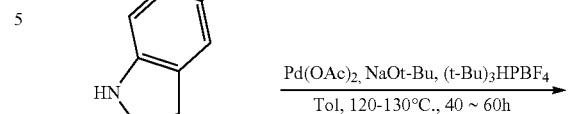
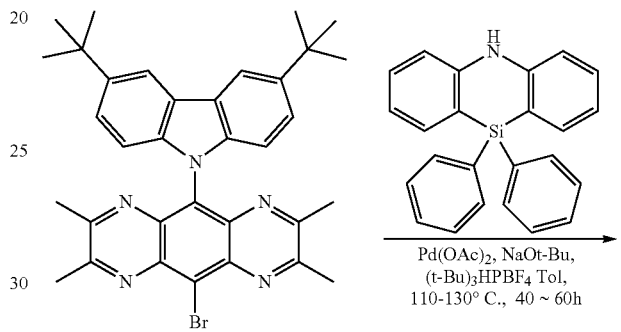
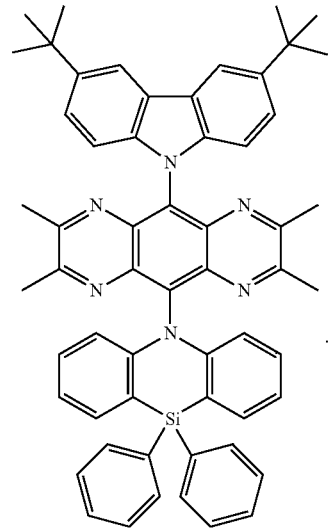
* * * * *